US007903157B2

(12) United States Patent
Takada et al.

(10) Patent No.: US 7,903,157 B2
(45) Date of Patent: Mar. 8, 2011

(54) IMAGING SYSTEM AND IMAGE SENSOR WITH FILTER SELECTIVELY TRANSMITTING COMBINATION OF PLURAL NARROW WAVELENGTH BANDS OF INCIDENT LIGHT IN LOW COLOR RENDERING ILLUMINATION

(75) Inventors: Shinichi Takada, Osaka (JP); Kazuyuki Inokuma, Kyoto (JP)

(73) Assignee: Panasonic Corporation, Osaka (JP)

( * ) Notice: Subject to any disclaimer, the term of this patent is extended or adjusted under 35 U.S.C. 154(b) by 887 days.

(21) Appl. No.: 11/812,869

(22) Filed: Jun. 22, 2007

(65) Prior Publication Data
US 2007/0296840 A1 Dec. 27, 2007

(30) Foreign Application Priority Data

Jun. 26, 2006 (JP) ................................. 2006-174975

(51) Int. Cl.
*H04N 5/335* (2006.01)
(52) U.S. Cl. ........................ 348/278; 348/272; 348/148
(58) Field of Classification Search .................. 348/272, 348/278
See application file for complete search history.

(56) References Cited

U.S. PATENT DOCUMENTS
2002/0156559 A1 10/2002 Stam et al.
2003/0169354 A1 * 9/2003 Aotsuka ........................ 348/272

FOREIGN PATENT DOCUMENTS
JP 5-294183 11/1993
WO WO 2006/030944 A1 3/2006

OTHER PUBLICATIONS
Chinese Office Action, w/ English translation thereof, issued in Chinese Patent Application No. CN 200710111428.3 dated May 12, 2010.

* cited by examiner

*Primary Examiner* — Sinh Tran
*Assistant Examiner* — Paul Berardesca
(74) *Attorney, Agent, or Firm* — McDermott Will & Emery LLP

(57) ABSTRACT

An imaging system according to the present inventions includes an image sensor in which a plurality of unit pixels are arranged on a chip and an image processing LSI for converting color components output from the image sensor to color signals. The imaging system is configured to select only color component which have passed through filters having similar spectral characteristics to spectral characteristics of the human eye from separation filter groups forming multi-layer film filters under white light and, on the other hand, combine color components which have passed through arbitrarily selected filters of the filters the separation filter groups to output the combined color components under illumination of low rendering lightning.

8 Claims, 15 Drawing Sheets

FIG.7
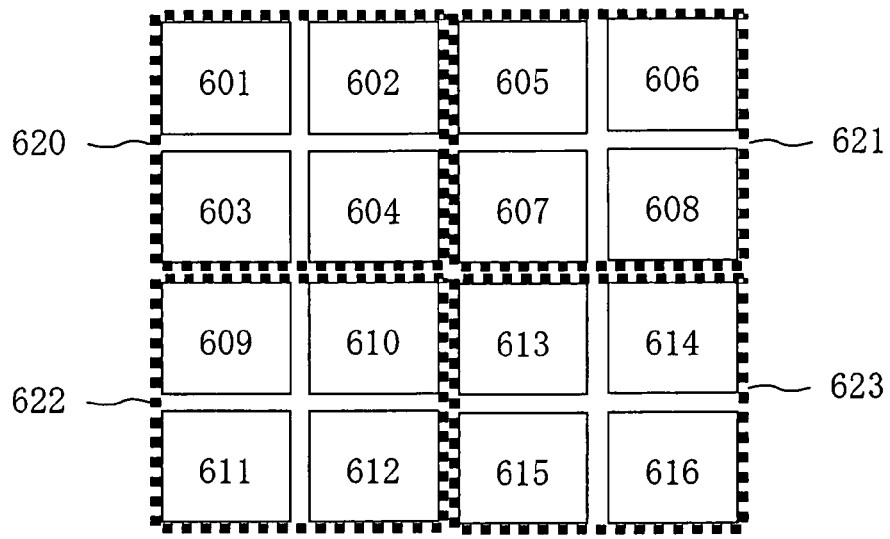
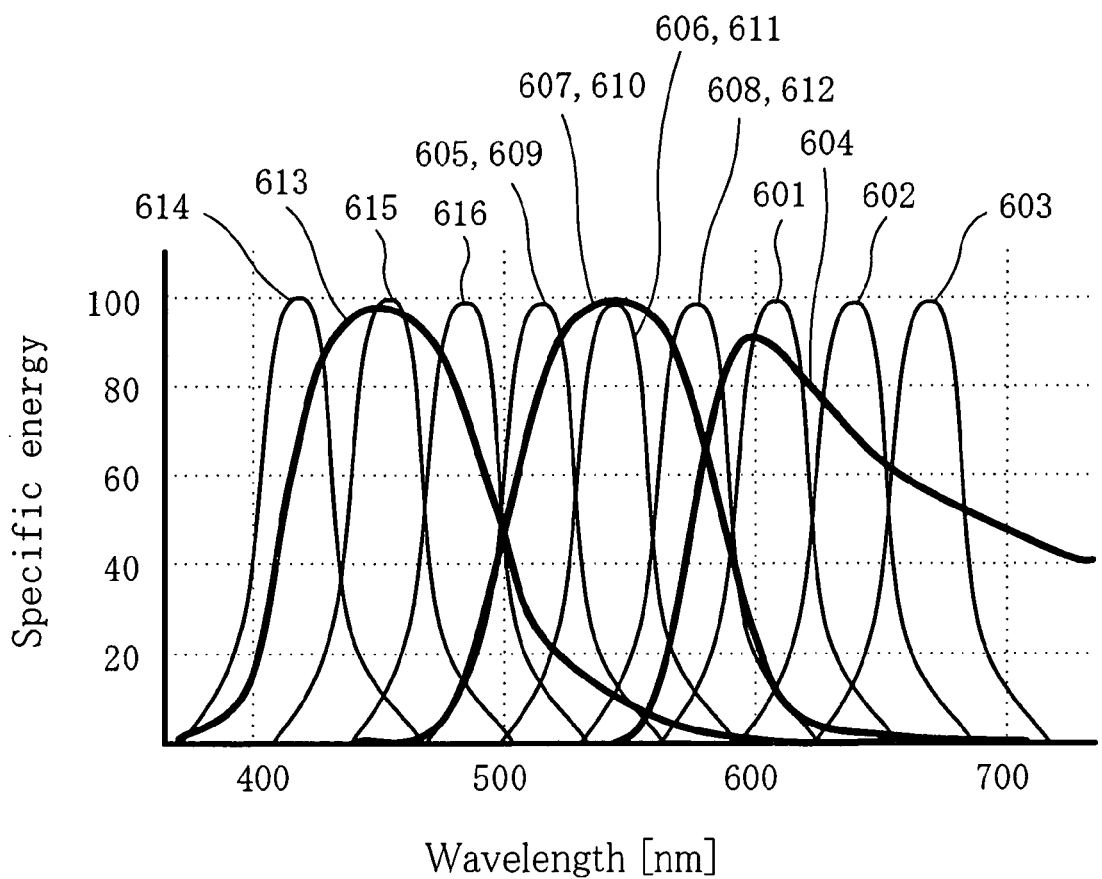

IMAGING SYSTEM AND IMAGE SENSOR WITH FILTER SELECTIVELY TRANSMITTING COMBINATION OF PLURAL NARROW WAVELENGTH BANDS OF INCIDENT LIGHT IN LOW COLOR RENDERING ILLUMINATION

CROSS-REFERENCE TO RELATED APPLICATION

The disclosure of Japanese Patent Application No. 2006-174975 filed on Jun. 26, 2006 including specification, drawings and claims are incorporated herein by reference in its entirety.

BACKGROUND OF THE INVENTION

The present invention relates to imaging systems and image sensors used for providing a good image captured by an on-vehicle camera or the like which requires high reliability and is often used under white light or low color rendering illumination.

For the purpose of enhancing the safety of running vehicles, many systems have been conventionally proposed in which imaging means such as a video camera or the like is provided in a vehicle to monitor images around the vehicle.

Specifically, a visual recognition support system in which an output of a camera mounted in a door mirror, a side mirror or the like is displayed in an image display device provided near a driving seat in a vehicle to help a driver check conditions for oncoming vehicles and a next traffic lane, images of vehicle's blind spots in the horizontal direction and the like, and a recognition system for performing processing of taken-in images to detect motions of surrounding vehicles and then giving a warning to a driver depending on distances from the surrounding vehicles and speeds of the vehicles, or detecting a predetermined position where a roadway region and recognizing signs.

Such an on-vehicle camera has to be unaffected by climate conditions. For example, to achieve an imaging system which is unaffected by climate conditions, Japanese Laid-Open Publication No. 5-294183 discloses a technique in which a mirror portion of a door mirror of a vehicle is formed to be a half mirror, a video lens with an optical filter mounted and CCD or like device are disposed therein, an image signal processed by a camera signal processing circuit disposed in a passenger compartment is output to an image display device.

Moreover, in Japanese Laid-Open Publication No. 5-294183, a technique is disclosed to solve the following problems with respect to camera mounting positions, i.e., 1) if a camera is disposed in a passenger compartment, appearance and interior comfort are deteriorated and driver's field of view is narrowed, 2) if a camera is disposed in an engine room, the surrounding environment is very bad and failure of a camera is caused, 3) if a camera is disposed in an outer peripheral portion of a vehicle, specifically, on a door side or on an engine room, harmful effects in terms of safety, design and performance such as aerodynamic drag are caused.

SUMMARY OF THE INVENTION

In the above-described known technique, a camera is mounted in a camera mounting position which does not cause deterioration of performance of a vehicle. However, other problems regarding limiting performance of an on-vehicle camera arise. That is, 1) an image of the outside is taken through a half mirror and thus sensitivity is reduced, 2) because a camera mounting position is located in a door mirror, even though the direction and view angle of a camera, a view angle within which images can be taken is determined and 3) in view of design, elimination of door mirror comes under consideration for future, and the known technique can not be able to be employed.

Furthermore, the inside of a door mirror is a good use environment, compared to the exterior portion of a vehicle or the inside of an engine room. However, there are still problems of use environment. For example, it is well known that the temperature in a vehicle parked under the scorching sun in the midsummer, including a passenger compartment and the inside of a door mirror, becomes very high. The temperature of inside of the engine room is far higher than the temperature of a passenger compartment during driving and a camera mounted in the exterior portion of the vehicle is exposed to direct sunlight.

Moreover, an on-vehicle camera systems for supporting visual recognition aim to increase visibility under bad conditions during evening hours or in a tunnel to a higher level than visibility of the naked eye. In many cases, high-pressure sodium lamps and the like are used for road lighting and tunnel lighting because of their economic efficiency or the like. However, high-pressure sodium lamps have poor color rendition and it is difficult to recognize colors by processing which is supposed to be performed under white light.

FIG. 16 is a cross-sectional view illustrating a structure of a known imaging system. As shown in FIG. 16, an apparatus 1501 includes a silicon semiconductor substrate in which a p-type layer 1503 is stacked on an n-type layer 1502. Furthermore, an interlevel insulating film 1504 is formed on the substrate.

In the p-type layer 1503, a plurality of photo diodes (photoelectric conversion element) 1505 are formed by ion implantation of an n-type impurity. The photo diodes 1505 converts incident light 1506 to electricity and are separated from one another by an isolation region 1507.

Furthermore, a light shielding film 1508 for suppressing incidence of light is formed on the isolation region 1507 and a color filter 1509 is formed above the light shielding film 1508. Moreover, in an upper part of the color filter 1509, a collective lens 1510 for effectively collecting the incident light 1506 is formed. By the wavelength selectivity of the color filter 1509, the incident light 1506 is separated into respective wavelength bands of R (red), G (green) and B (blue) to allow color separation.

However, the known color filter 1509 includes a pigment made of an organic material and this causes the following inconvenience. If the color filter 1509 is left in a high temperature environment for many hours, or if the color filter 1509 is exposed to strong incident light for many hours, the pigment is chemically altered and thus its wavelength selectivity is changed. Therefore, a known imaging system using a pigment filter has a problem of color degradation (degraded color separation property) due to high temperature or high light irradiation. As described above, this problem is notable in an imaging system mounted in a vehicle. Moreover, there is another problem in which illumination widely used for road lighting and tunnel lighting has poor color rendition.

FIG. 17 is a graph showing spectral characteristics of a high-pressure sodium lamp and the human eye. In FIG. 17, 1601 denotes spectral characteristics of a high-pressure sodium lamp, 1602 denotes spectral characteristics of the human eye to a blue (B) component, 1603 denotes spectral characteristics of the human eye to a green (G) component and 1604 denotes spectral characteristics of the human eye to a red (R) component.

FIG. 18 is a graph showing spectral characteristics of the human eye under high-pressure sodium lamp illumination. In FIG. 18, 1701 denotes spectral characteristics of a R component and 1702 denotes spectral characteristics of a G component. Spectra of the high-pressure sodium lamp concentrate in the long wavelength side and thus under illumination by the high-pressure sodium lamp, the human eye is sensitive almost only to a red component and can recognize all colors only as red or near-red colors. Moreover, also in a known camera, imaging is performed using three primary colors R, G and B of which spectral characteristics are close to those of the human eye. Thus, all colors can be recognized only as red or near-red colors in the same manner. As has been described, disadvantages occur in performing imaging processing which is supposed to be performed under only white light.

In the view of the above-described problems, it is therefore an object of the present invention to readily provide an imaging system which is not deteriorated by the influence of ambient temperature or direct sunlight even when a camera is mounted in any place such as an external portion, a passenger compartment, an engine room and the like, and of which visibility is higher than the visibility of the naked eye under regular road lighting.

Specifically, an imaging system according to the present invention is characterized in that the system includes: an image sensor in which a plurality of unit pixels are arranged on a chip; and an image processing section for converting color components output from the image sensor into color signals and is characterized in that the image sensor comprises: photoelectric conversion elements for converting incident light to electricity for each of the unit pixels; and a multi-layer film filter, disposed above the photoelectric conversion elements and formed of inorganic materials, for selectively transmitting only a particular wavelength band of the incident light to separate a color component from the incident light, and the image processing section comprises combining means for combining the color components separated by the multi-layer film filter.

An image sensor according to the present invention is an image sensor in which a plurality of unit pixels are arranged on a chip and characterized by including: photoelectric conversion elements for converting incident light to electricity for each of the unit pixels; a multi-layer film filter, disposed above the photoelectric conversion elements and formed of inorganic materials, for selectively transmitting only a particular wavelength band of the incident light to separate a color component from the incident light; and combining means for combining color components obtained by separation by the multi-layer film filter.

As has been described, the imaging system of the present invention uses filters formed of inorganic materials, so that color degradation due to a chemical reaction of a pigment does not occur. Thus, the imaging system of the present invention can be used at high temperature and under a vast amount of light irradiation and, therefore, the imaging system can be mounted in any places of a vehicle, such as an exterior portion, a passenger compartment, an engine room and the like, for vehicle mounting purpose.

Moreover, as a filter structure, provided is a structure in which a wavelength band of the filter structure is changed by changing a thickness of a spacer layer interposed between an upper reflector and a lower reflector each having the same layer structure. Thus, the number of process steps can be reduced in semiconductor wafer process for fabricating an imaging system and the imaging system can be advantageously produced in large quantities at low costs.

A large number of filters having different spectral characteristics can be formed on a single chip in a simple manner. Therefore, in addition to a filter having similar spectral characteristics to spectral characteristics of the human eye, a plurality of filters for selectively transmitting only part of a narrower wavelength band than each of respective spectrum band widths of three primary colors of the human eye are formed so as to cover a visible wavelength band. Under white light, color information is obtained using a filter having closer spectral characteristics to spectral characteristics of the human eye. Under low color rendering illumination, color information which have passed through filters having a narrower wavelength band than each of the respective spectrum band widths of three primary colors visible to the human eye are combined and then color information obtained by changing characteristics of filters for transmitting light by combining and color information obtained using characteristics of a filter as it is without being combined are combined, so that a plurality of color information are selectively obtained. Thus, color discrimination performance can be improved whether or not the imaging system is used under white light, low color rendering illumination or the like, or despite change in a light source.

BRIEF DESCRIPTION OF THE DRAWINGS

FIG. 7 shows an exemplary arrangement of a multi-layer film filter on an image sensor according to an embodiment of the present invention and a graph showing spectral characteristics of the multi-layer film filter.

DESCRIPTION OF THE PREFERRED EMBODIMENTS

Hereafter, embodiments of the present invention will be described with reference to the accompanying drawings. The following preferred embodiments are merely examples, and there is no intention to limit the present invention and its application or use.

Figure 1:
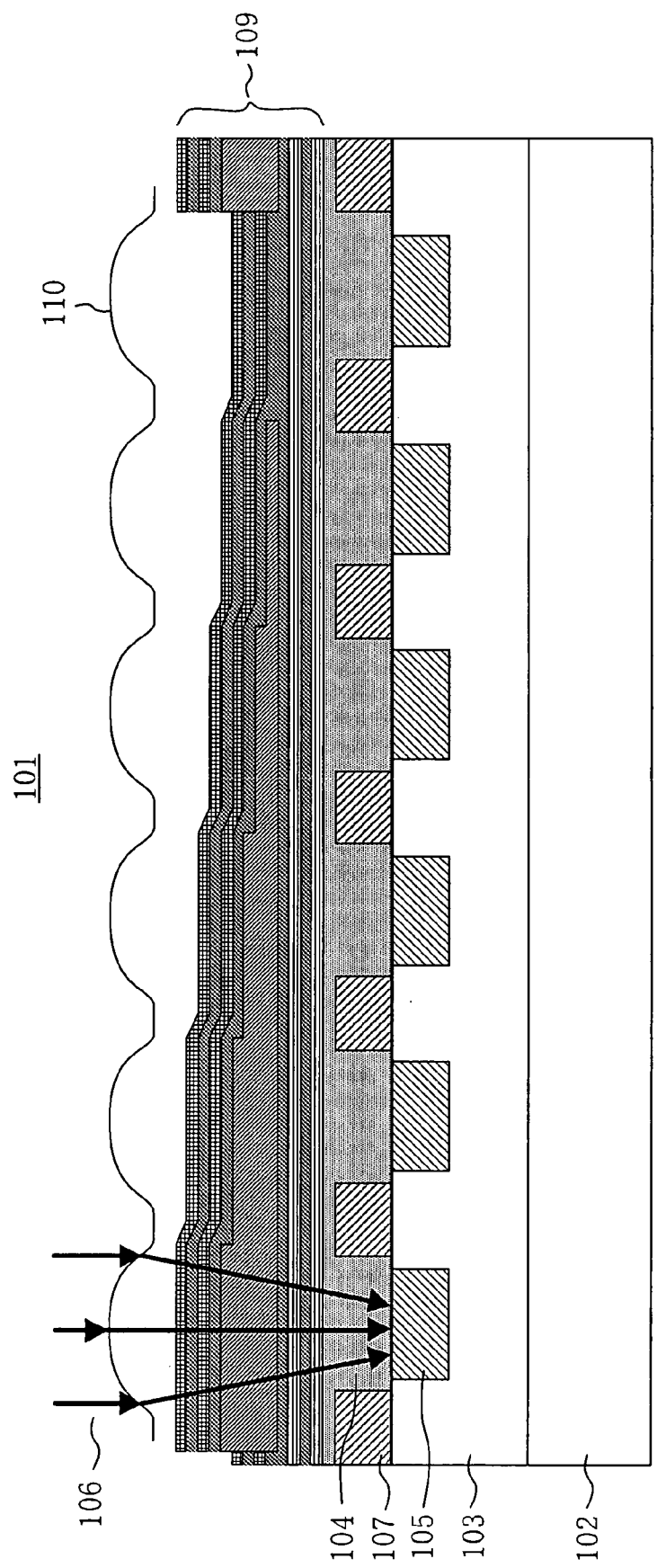
FIG. 1 is a cross-sectional view illustrating a structure of an image sensor of an imaging system according to an embodiment of the present invention.

FIG. 1 is a cross-sectional view illustrating a structure of an image sensor of an imaging system according to an embodiment of the present invention. As shown in FIG. 1, an image sensor 101 includes a silicon semiconductor substrate in which an n-type layer 102 and a p-type layer 103, and furthermore an interlevel insulating film 104 is formed on the substrate.

In the p-type layer 103, a plurality of photo diodes (photoelectric conversion elements) 105 are formed by ion implantation of an n-type impurity. The photo diodes 105 perform photoelectric conversion of incident light 106 and are separated from one another by an isolation region 107.

Furthermore, a light shielding film 108 for suppressing incidence of light is formed above the isolation region 107 and a multi-layer film filter 109 is formed of a dielectric material on the light shielding film 108 to realize a wavelength selection function. Moreover, above the multi-layer film filter 109, a collective lens 110 for effectively collecting the incident light 106 is formed.

Figure 2:
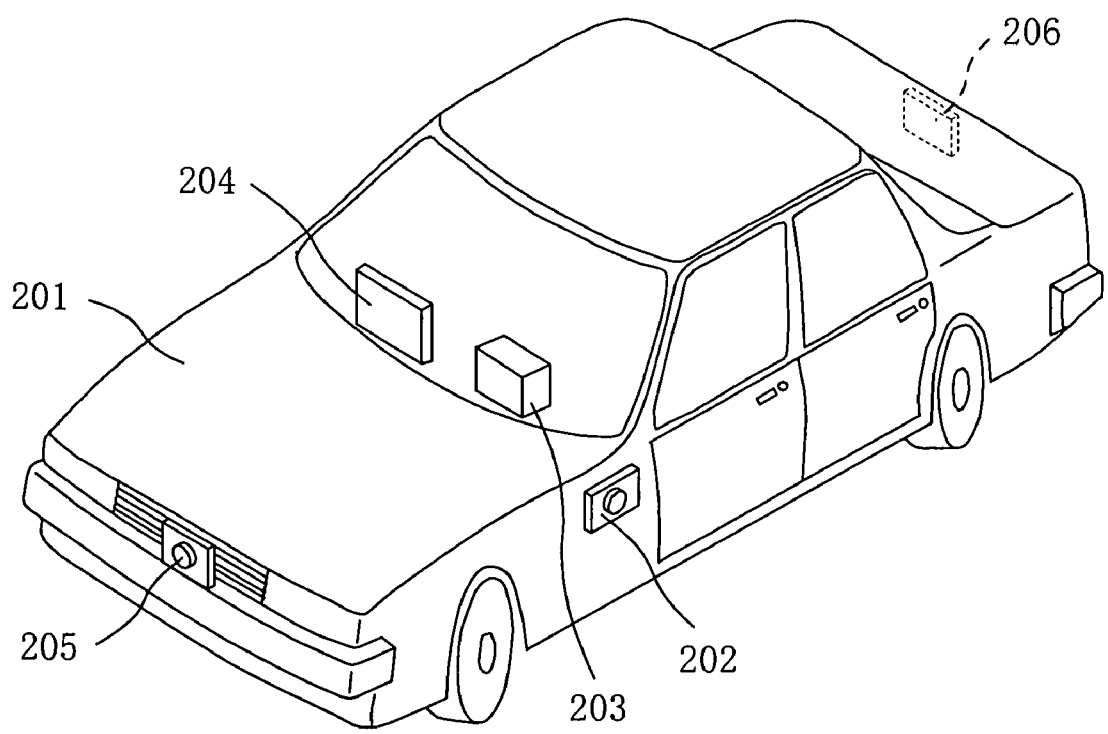
FIG. 2 is an illustration showing how an imaging system according to the present invention is mounted in an automobile vehicle.

FIG. 2 is an illustration showing how an imaging system according to the present invention is mounted in an automobile vehicle. As shown in FIG. 2, in view of design, an automobile 201 is not equipped with a fender mirror and a door mirror, but a side camera 202 is mounted in each of both vehicle side parts, instead. An image signal from the side camera 202 is received by an image control apparatus 203 mounted in a console and an output signal from the image control apparatus 203 is displayed on an image display device 204 provided near a driving seat.

Moreover, in the image control apparatus 203, output signals from a front camera 205 mounted in vehicle anterior part and a rear camera 206 mounted in vehicle posterior part are further received and image signals from the side camera 202, the front camera 205 and the rear camera 206 can be switched around to be displayed or all of the image signals from the side camera 202, the front camera 205 and the rear camera 206 can be displayed at the same time.

With cameras provided in a passenger compartment and an engine room, when the vehicle is involved in an accident such as a crash, the cameras can be protected with much higher probability than in the case where cameras are provided in vehicle external part. Because of this feature, a passenger compartment camera (not shown) or an engine room camera (not shown) may be used for vehicle exterior monitoring. Specifically, it is very effective to use the passenger compartment camera and engine room camera as an on-vehicle black box for recording images before and after a crash in the case of a car accident.

Although not shown in FIG. 2, in each of the side camera 202, the front camera 205 and the rear camera 206, the image sensor of FIG. 1 is incorporated.

Hereafter, light transmittance characteristics of a multi-layer film filter according to this embodiment will be described with comparison of light transmittance characteristics between the multi-layer film filter of this embodiment and the known multi-layer film filter.

Figure 3A:
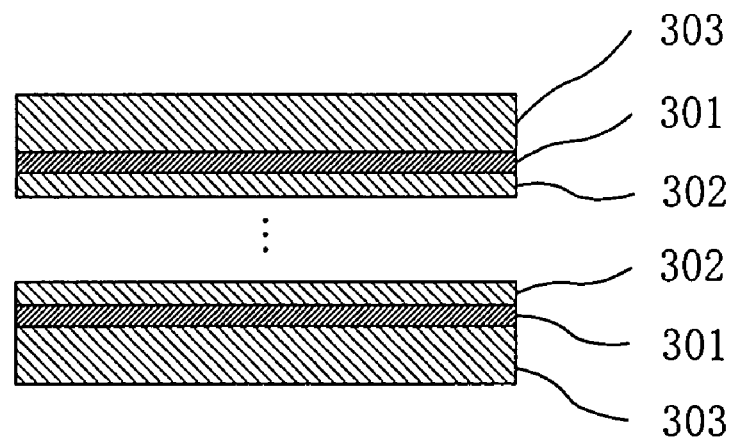
FIG. 3A is an illustration showing a layer structure of a known multi-layer film filter.
Figure 3B:
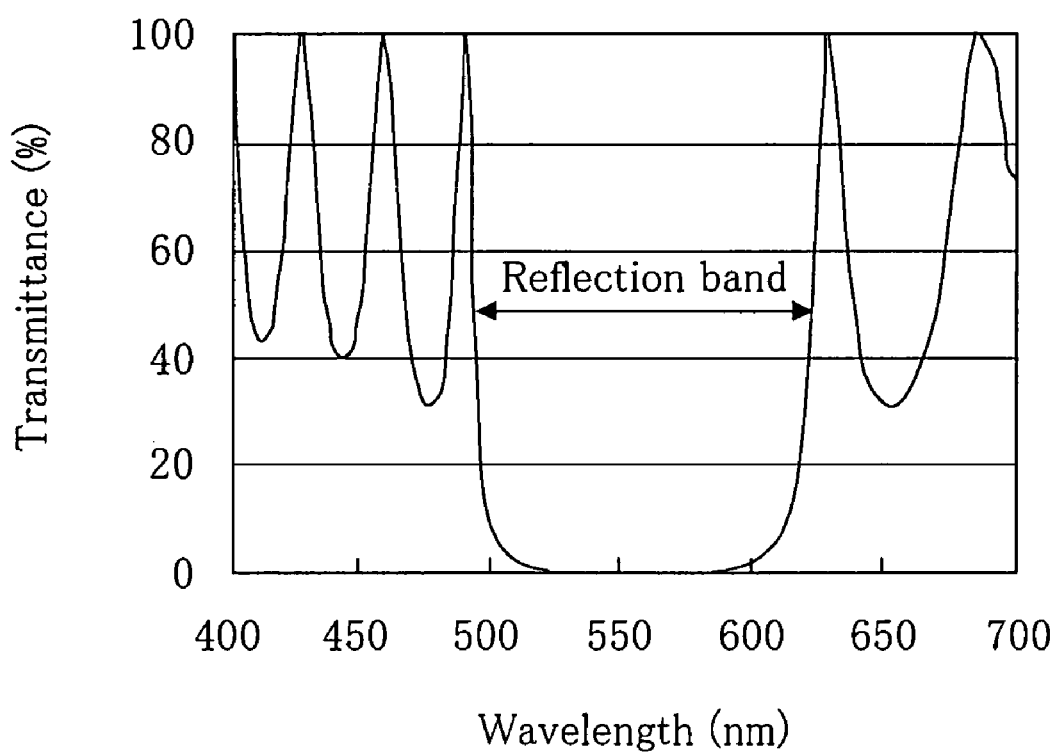
FIG. 3B is a graph showing light transmittance characteristics of the known multi-layer film filter.

FIG. 3A is an illustration showing a layer structure of a multi-layer film filter which is a multi-layer film reflecting mirror used for a known high-reflectivity mirror. FIG. 3B is a graph showing light transmittance characteristics of the known multi-layer film filter.

As shown in FIG. 3A, the layer structure of the multi-layer film filter is formed so that silicon nitride (SiN) 301 and silicon oxide ($SiO_2$) 302 and 303 which are materials having different refractive indexes are simply stacked.

In FIG. 3B, the ordinate indicates light transmittance of light which has passed through the multi-layer film with respect to incident light and the abscissa indicates a wavelength of light to enter the multi-layer film. Note that calculation is performed using a matrix method based on the Fresnel coefficient, for only vertical incident light, where a pair number is 10 and a designed center wavelength is 550 nm.

Now, an optical film thickness nd (n: a refractive index of a material and d: a thickness of the material) of each dielectric material constituting a multi-layer film is designed so as to correspond to one fourth ($\lambda/4$) of the designed center wavelength $\lambda$. As a result, each dielectric material of the multi-layer film has characteristics of a reflection band in which a wavelength at the center is the designed center wavelength. The bandwidth of the reflection band is determined by a refractive index difference and, the larger the refractive index difference is, the larger the bandwidth becomes.

However, in the above-described layer structure, a wide reflection blocking band can be obtained but it is difficult to selectively transmitting light according to wavelength for the R, G and B color separation function.

Figure 4A:
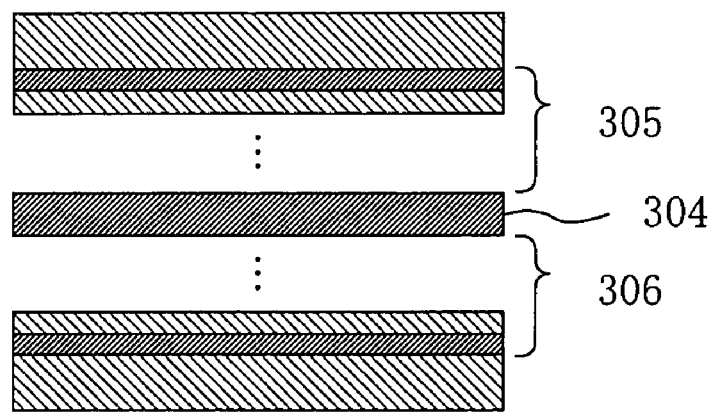
FIG. 4A is an illustration showing a layer structure of a multi-layer film filter according to an embodiment of the present invention.
Figure 4B:
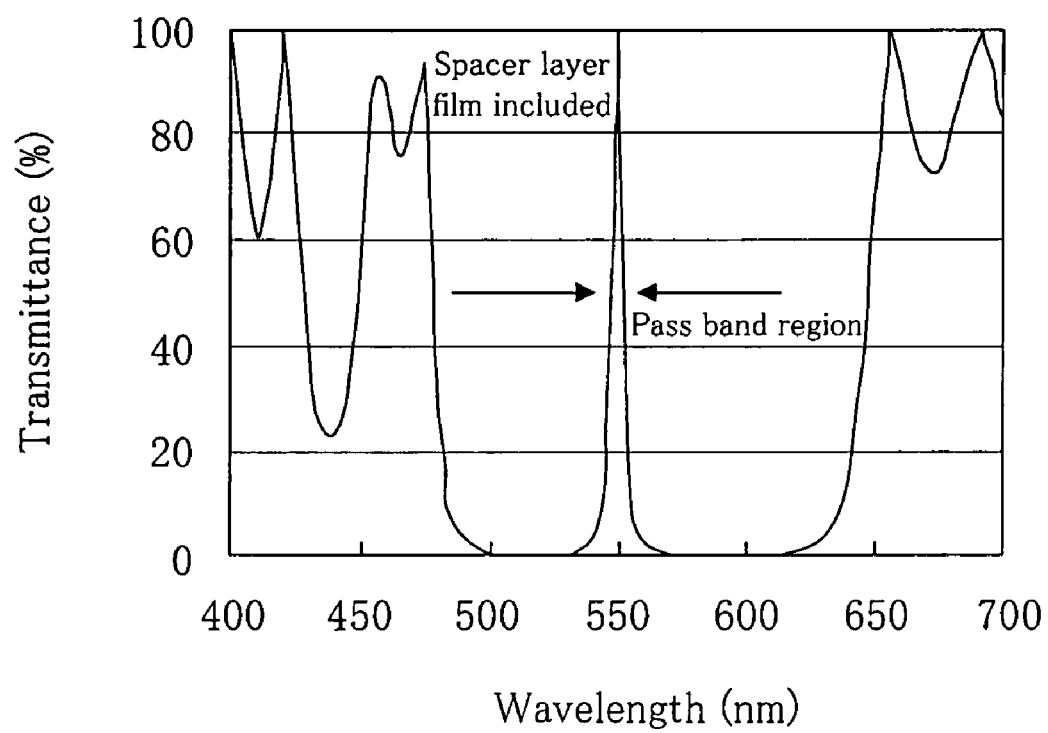
FIG. 4B is a graph showing light transmittance characteristics of the multi-layer film filter according to the embodiment.

FIG. 4A is an illustration showing a layer structure of a multi-layer film filter which is a color separation filter used for a high-reflectivity mirror according to this embodiment. FIG. 4B is a graph showing light transmittance characteristics of a multi-layer film filter according to this embodiment.

As shown in FIG. 4A, the multi-layer film filter according to this embodiment of the present invention has a structure in which an upper portion reflector 305 and a lower portion reflector 306 each of which has a $\lambda/4$ multi-layer film structure ($\lambda$: designed center wavelength) are arranged to face each other with a spacer layer 304 interposed therebetween. With the above-described layer structure, a pass band region is selectively defined in a reflection band and, furthermore, a thickness of the spacer layer 304 is changed, so that a transmission peak wavelength can be changed.

Figure 5A:
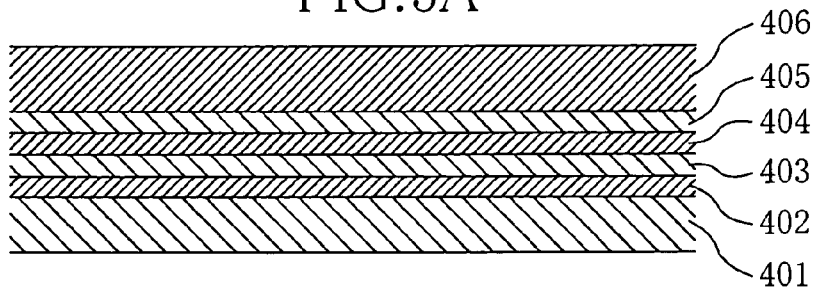
FIGS. 5A through 5D are cross-sectional views illustrating respective steps for forming a multi-layer film filter of an embodiment of the present invention.

FIGS. 5A through 5D are cross-sectional views illustrating respective steps for forming the multi-layer film filter according to this embodiment. First, as shown in FIG. 5A, using a high-frequency sputtering apparatus, lower reflectors 402 through 405 are formed on a Si wafer 401 so as to have a λ/4 multi-layer film structure (λ: designed center wavelength) including silicon oxide ($SiO_2$) and titanium oxide ($TiO_2$) and a spacer layer 406 is formed of $TiO_2$ thereon. Thereafter, to selectively transmit only a specific wavelength, etching is performed to obtain a desired thickness of the spacer layer 406.

Figure 5B:
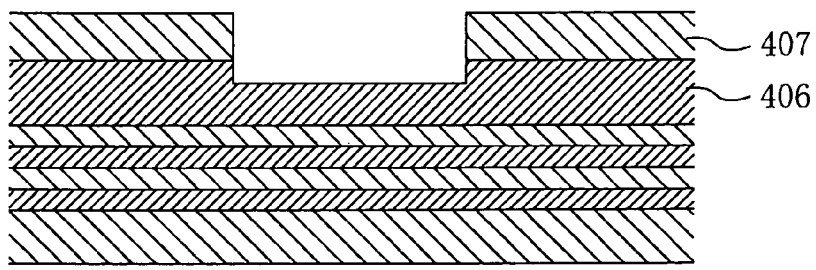

Specifically, as shown in FIG. 5B, a resist is applied onto a surface of a wafer in which the lower reflectors 402 through 406 are formed, and after pre-exposure baking (pre-baking), exposure is performed using an exposure apparatus such as a stepper. Then, by performing resist development and final baking (post-baking), a resist pattern 407 is formed. Thereafter, etching is finally performed using CF4-base etching gas. Thus, the spacer layer 406 is etched so that a thickness of a center portion of the layer structure of FIG. 5B becomes a thickness corresponding to the wavelength band of red (R).

Figure 5C:
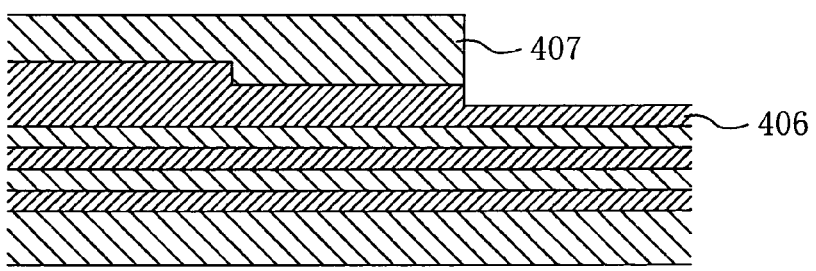

Next, as shown in FIG. 5C, in the same process step as in FIG. 5B, a resist pattern corresponding to a green (G) region is formed and dry etching is performed. Thus, the spacer layer 406 is etched so that a thickness of a right side portion of the spacer layer 406 corresponds to the wavelength band of green (G).

Figure 5D:
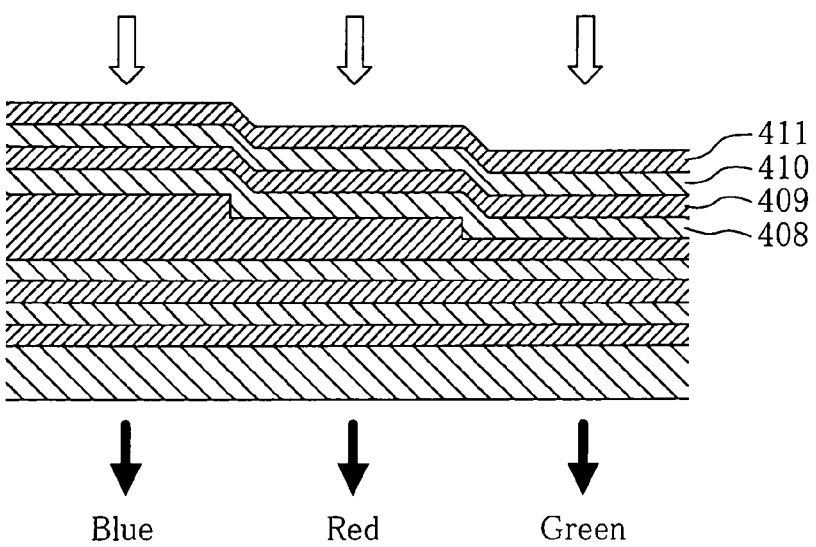

Furthermore, as shown in FIG. 5D, in the same manner as in FIG. 5A, using a high-frequency sputtering apparatus, upper reflectors 408 through 411 are formed so as to have a λ/4 multi-layer structure including silicon oxide $SiO_2$ and titanium oxide $TiO_2$.

A total thickness of the multi-layer structure of a dielectric material is designed to be 562 nm, 542 nm and 622 nm for R, G and B, respectively.

Figure 6:
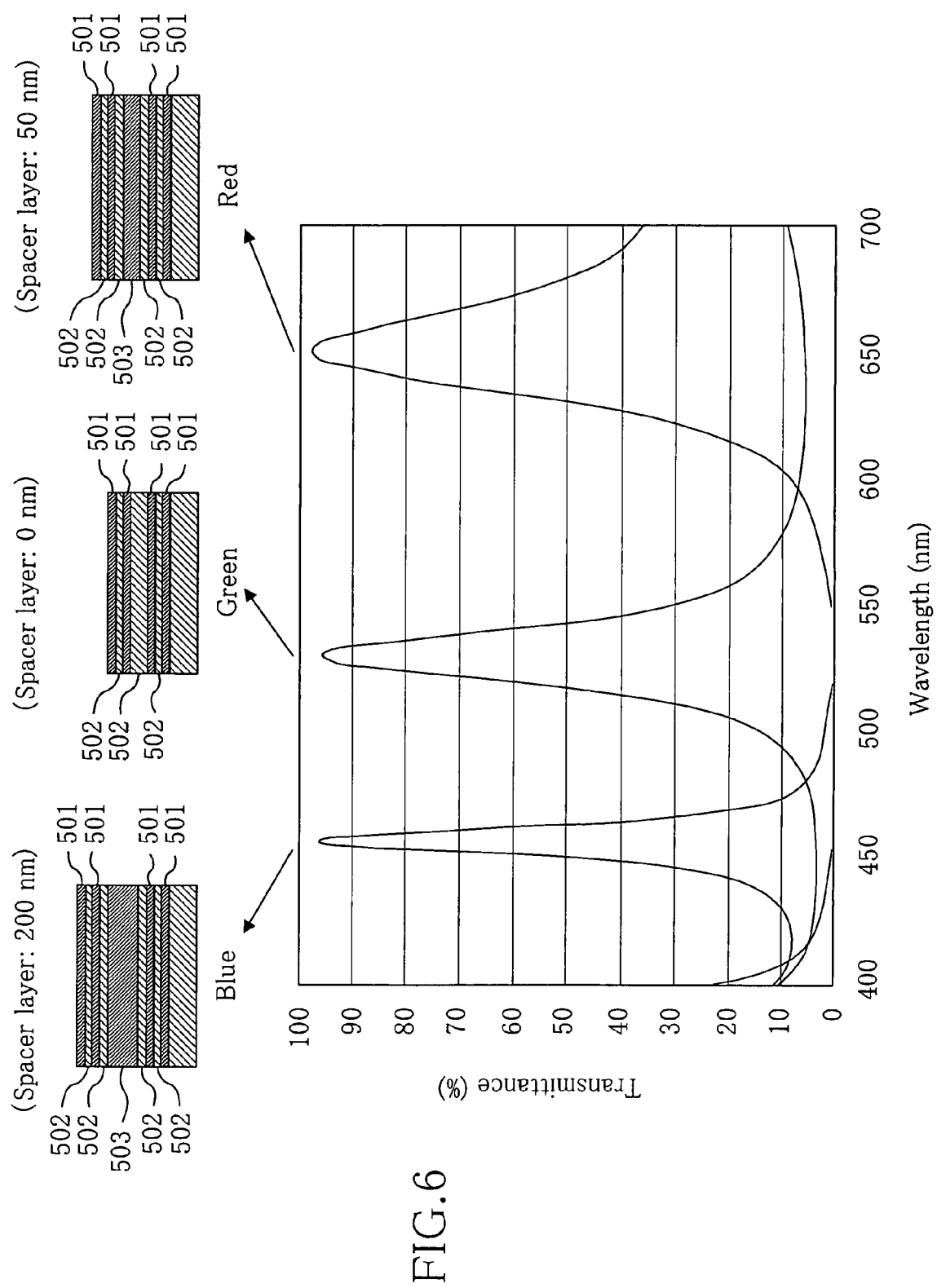
FIG. 6 is a graph showing calculation results for light transmittance of a multi-layer film filter of an embodiment of the present invention.

FIG. 6 is a graph showing calculation results for light transmittance of the multi-layer film filter of this embodiment. The ordinate indicates transmittance of light which has passed through the multi-layer film with respect to incident light and the abscissa indicates wavelength of light to enter the multi-layer film. A well known characteristic matrix method was used for calculation.

As dielectric materials, titanium oxide $TiO_2$ (having a refractive index of 2.5) 501 is used as a high refractive material and silicon oxide $SiO_2$ (having a refractive index of 1.45) 502 is used as a low refractive index material. Furthermore, a spacer layer 503 is designed to have an optical film thickness (film thickness) of 200 nm (80 nm), 0 nm (0 nm) and 50 nm (20 nm).

As shown in FIG. 6, the transmission peak wavelength characteristics can be changed by providing the spacer layer 503 or not or changing a film thickness. That is, separation of wavelengths of R, G and B which is necessary in the imaging system can be realized.

In this embodiment, titanium oxide $TiO_2$ is used as a high refractive index material. However, besides titanium oxide, silicon nitride (SiN), tantalum oxide ($Ta_2O_5$) or zirconium oxide ($ZrO_2$) may be used. Moreover, as a low refractive index material, silicon oxide $SiO_2$ is used in this embodiment. However, some other material than silicon oxide $SiO_2$ may be used if the material has a smaller refractive index than a refractive index of a dielectric material used as a high refractive index material.

As has been described, with the dielectric multi-layer film structure according to the present invention, a filter can be formed by regular semiconductor process. Accordingly, unlike a known pigment filter, after forming a photoreceiver section, an interconnect section and the like, a filter does not have to be formed by a different process step from regular semiconductor process, i.e., the step of forming a filter by a so-called on-chip process. Therefore, advantageous effects can be achieved in process stabilization and reduction in costs for increasing productivity.

Furthermore, the dielectric multi-layer film filter can be formed of only inorganic materials and color degradation does not occur even when the filter is used at high temperature and under high irradiation. Therefore, the dielectric multi-layer film filter can be mounted in external part, an engine room, a passenger compartment or any other place of a vehicle for vehicle mounting purpose.

FIG. 7 shows an exemplary arrangement of a multi-layer film filter on an image sensor according to this embodiment and a graph showing spectral characteristics of the multi-layer film filter. As shown in FIG. 7, a multi-layer film filter 109 includes 16 types of filters 601 through 616 having different spectral characteristics arranged in an arrangement pattern of 4×4. The 4×4 filter arrangement indicates part of an arrangement formed on an image sensor 101 and thus it is needless to say that a plurality of filter arrangement patterns are formed on the image sensor 101.

Next, bandwidth of spectrum of each filter will be described. A filter 604 has spectral characteristics similar to spectral characteristics of the human eye to a red component, filters 607 and 610 have spectral characteristics similar to spectral characteristics of the human eye to a green component and a filter 613 has spectral characteristics similar to spectral characteristics of the human eye to a blue component. Moreover, as spectral characteristics of other filters than the filters 604, 607, 610 and 613, a bandwidth of each of the films is designed to be narrower than a bandwidth (i.e., 80 nm to 100 nm) of the human eye.

The multi-layer film filter 109 is, furthermore, divided into four groups, i.e., an R filter arrangement group (red separation filter group) 620, a G1 filter arrangement group (green separation filter group) 621, a G2 filter arrangement group (green separation filter group) 622 and a B filter arrangement group (blue separation filter group) 623.

Specifically, the R filter arrangement group 620 is formed of the filters 601 through 604 and spectral characteristics of filters concentrate in the red wavelength region.

The G1 filter arrangement group 621 includes filters 605 through 608 and spectral characteristics of the filters concentrate in the green wavelength region.

The G2 filter arrangement group 622 includes filters 609 through 612 and spectral characteristics of the filters concentrate in the green wavelength region.

The B filter arrangement group 623 includes filters 613 through 616 and spectral characteristics of the filters concentrate in the blue wavelength region.

In this embodiment, spectral characteristics of the filters 609 through 612 constituting the G2 filter arrangement group 622 are set to be the same as spectral characteristics of the filters 605 through 608 constituting the G1 filter arrangement group 621. Thus, if it is assumed that each filter arrangement group is a single filter, the same arrangement as an RGB Bayer arrangement can be achieved.

Figure 8:
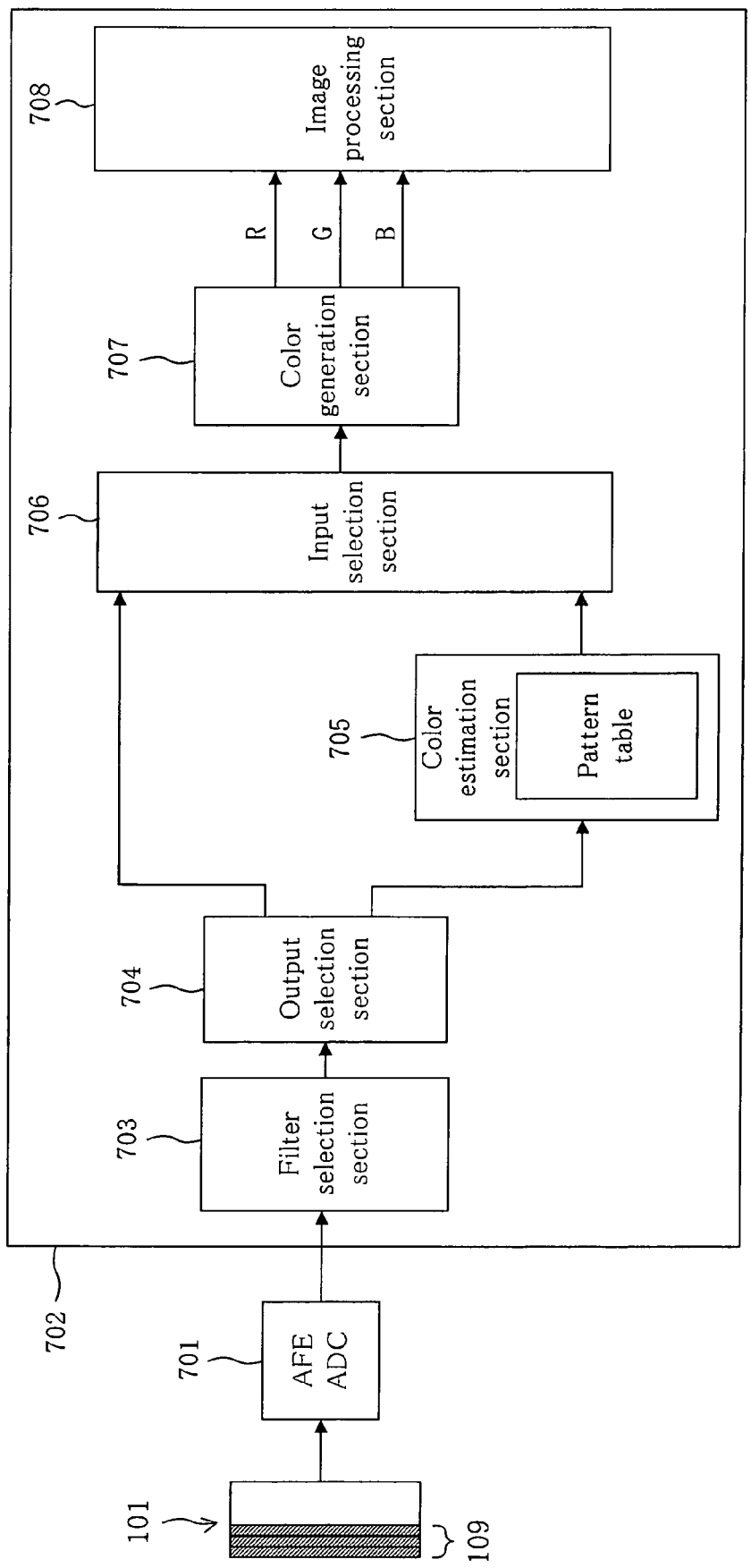
FIG. 8 is a block diagram illustrating an entire configuration of an imaging system of this embodiment.

FIG. 8 is a block diagram illustrating an entire configuration of the imaging system of this embodiment. In FIG. 8, 101 denotes an image sensor and 109 denotes a multi-layer film filter in which organic materials are stacked.

In FIG. 8, 701 denotes AFE (analog front end) for analog processing an output signal of the image sensor 101 and ADC (AD converter) for converting the output signal into a digital signal.

In FIG. 8, 702 denotes an image processing LSI for processing the output signal of the image sensor 101 which has been converted into a digital signal to generate a desired image data. Hereafter, a circuit configuration of the image processing LSI 702 will be described.

In FIG. 8, 703 denotes a filter selection section (combining means) for selecting only desired color information from color information separated by each filter of the image sensor 101 or combining selected color information.

In FIG. 8, 704 denotes an output selection section for selectively outputting the selected or combined color information to a color estimation section 705 or an input selection section 706 which will be described later.

In FIG. 8, 705 denotes the color estimation section for estimating a color from an output signal of the image sensor 101. Specifically, using a pattern table of the color estimation section 705, a color under white light is estimated from limited color information under lighting such as a high-pressure sodium lamp or the like, having low color rendition.

In FIG. 8, 706 denotes the input selection section for selectively outputting color information received from the output selection section 704 and the color estimation section 705.

In FIG. 8, 707 denotes a color generation section for generating a desired color signal from color information received from the input selection section 706 and outputting color signals of three primary colors (R, G, B). In this embodiment, as output color signals, color signals of three primary colors are output. However, a color difference signal or a signal of some other color signal system may be output.

In FIG. 8, 708 denotes an image processing section for performing image processing based on a color signal received from the color generation section 707.

Hereafter, the process operation of the imaging system of this embodiment will be described. First, processing under white light will be described. Under white light, as for color information obtained by the image sensor 101, only color information which has transmitted through the filters 604, 607, 610 and 613 is selected by the filter selection section 703 and then received by the output selection section 704. The output selection section 704 selects received color information as an output destination and the color information is received by the input selection section 706. The input selection section 706 outputs the color information from the output selection section 704 to the color generation section 707.

In this case, as described above, the filter 604 has similar spectral characteristics to spectral characteristics of the human eye to the red component, the filters 607 and 610 have similar spectral characteristics to spectral characteristics of the human eye to a green component and the filter 613 has similar spectral characteristics to spectral characteristics of the human eye to a blue component. Then, under white light, the filter selection section 703 selects only color information and an image is generated from the color information as it is in the bus master arbitration information 708.

In the filter arrangement on the image sensor 101, the positional relationship between the filters 604, 607, 610 and 613 is equivalent to the Bayer arrangement which is currently the main stream arrangement for digital cameras and the like. Thus, special technology and calculations are not required for the image processing section 708 and a known image processing tool which has been conventionally used can be advantageously applied as it is to the image processing section 708.

Figure 9:
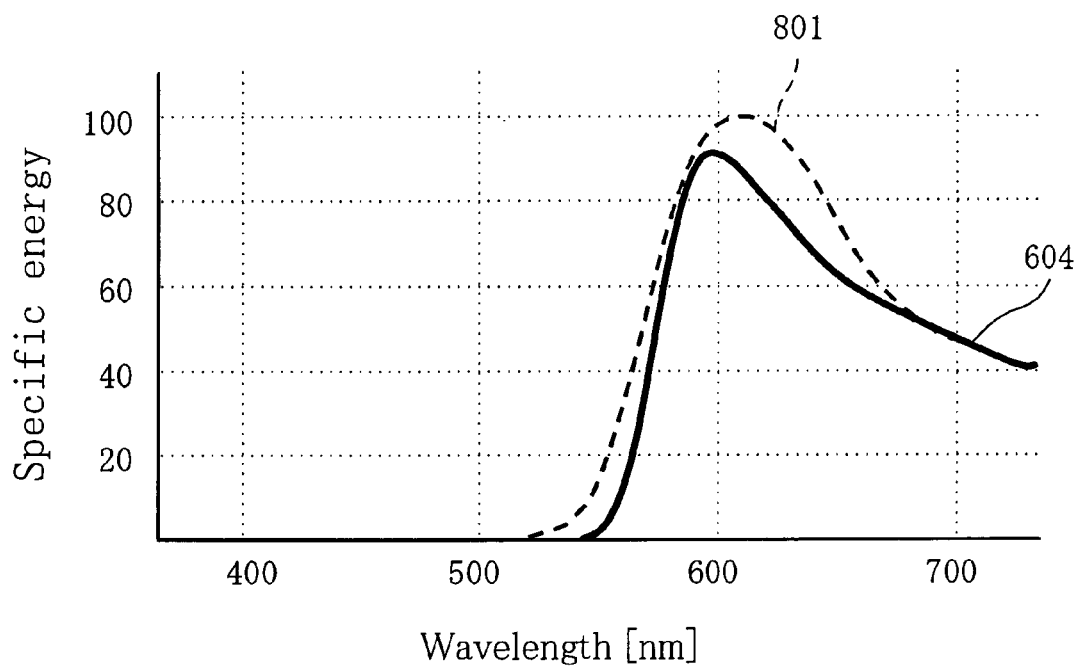
FIG. 9 is a graph showing the relationship between ideal spectral characteristics of the human eye to a red component and spectral characteristics of a dielectric multi-layer film filter to the red component.

FIG. 9 is a graph showing the relationship between ideal spectral characteristics of the human eye to a red component and spectral characteristics of the dielectric multi-layer film filter to a red component. In FIG. 9, 801 denotes ideal spectral characteristics of the human eye to a red component. There is the tendency that spectral characteristics of the filter 604 are shifted from ideal spectral characteristics toward the long wavelength side.

When a color separation filter is formed of an inorganic material and light transmittance properties are realized by controlling a thickness of a spacer layer, it is difficult to obtain ideal spectral characteristics and, specifically, in the case of a red color filter such as the filter 604, a wavelength at a maximum value of a light transmittance spectrum tends to be located in the long wavelength side. This is considered to be a reason for the above-described tendency. Therefore, to correct the shift toward the long wavelength side and obtain more ideal spectral characteristics, a combining operation is performed in the filter selection section 703.

Figure 10:
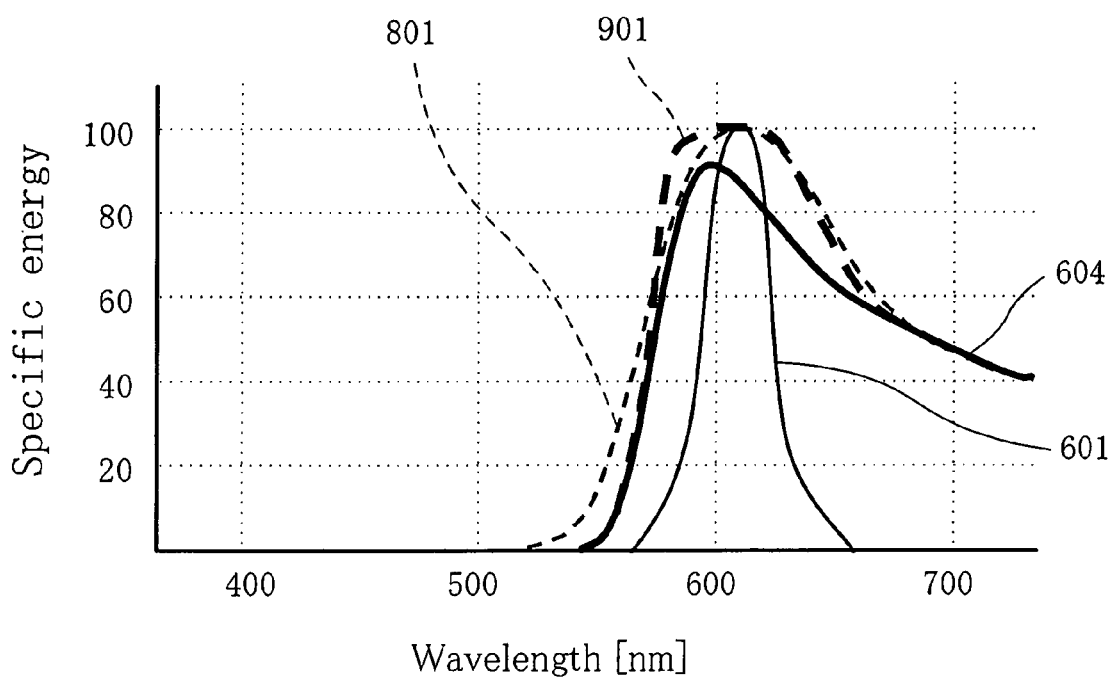
FIG. 10 is a graph showing the relationship between ideal spectral characteristics of the human eye to the red component and spectral characteristics of a dielectric multi-layer film filter to the red component after correction.

FIG. 10 is a graph showing the relationship between ideal spectral characteristics of the human eye to a red component and spectral characteristics of the dielectric multi-layer film filter to a red component after correction. In FIG. 10, 601 denotes spectral characteristics of the filter 601, 604 denotes spectral characteristics of the filter 604 which is similar to spectral characteristics of the human eye to a red component, and 801 denotes ideal spectral characteristics of spectral characteristics of the human eye to a red component. In FIG. 10, 901 denotes spectral characteristics which can be obtained by combining the filter 601 and the filter 604.

As shown in FIG. 10, the combined spectral characteristics are closer to ideal spectral characteristics of the human eye to a red component more than the spectral characteristics of the filter 604 are.

In this embodiment, the case where correction is performed only to a red component has been described. It is needless to say that correction can be performed to blue and green components in the same manner as the correction to a red component.

Next, processing to be performed in some other environment than under white light, i.e., processing under illumination of a high-pressure sodium lamp widely used for road lighting and tunnel lighting according to this embodiment will be described.

Under illumination of a high-pressure sodium lamp, as for color information obtained from the image sensor 101, color information which has passed through the filters 615, 616, 605, 608, 601, 602 and 603 is selected and combined by the filter selection section 703 and then is received by the output selection section 704. The output selection section 704 selects the color estimation section 705 as an output destination of the received color information and the color information is received by the color estimation section 705. Using a pattern table, the color estimation section 705 estimates a color under white light from limited color information under illumination of the high-pressure sodium lamp, and outputs color estimation information to the color generation section 707.

Spectra of the high-pressure sodium lamp concentrate in the long wavelength side. Therefore, the human eye is substantially sensitive only to the red component under illumination of the high-pressure sodium lamp and all colors can be recognized only as red or near-red colors. For this reason, using the filters 604, 607, 610 and 613 for primary colors R, G and B, which have similar spectral characteristics to spectral characteristics of the human eye, all colors can be recognized only as red or near-red colors. Therefore, in the filter selection section 703, characteristics of filters are changed by selecting filters and combining color information to obtain a larger number of color information.

Specifically, under illumination of the high-pressure sodium lamp, in the filter selection section 703, the filters 604, 607, 610 and 613 are not used and other filters of which bandwidth is designed to be narrower than the bandwidth (i.e., 80 nm to 100 nm) of the human eye are selected to combine color information.

In this embodiment, spectral characteristic filters of seven types are selected, some of color information which has transmitted through the seven filters are combined and others are not, so that four different types of spectral characteristics filters, including combined filters and non-combined filters, are obtained.

Figure 11:
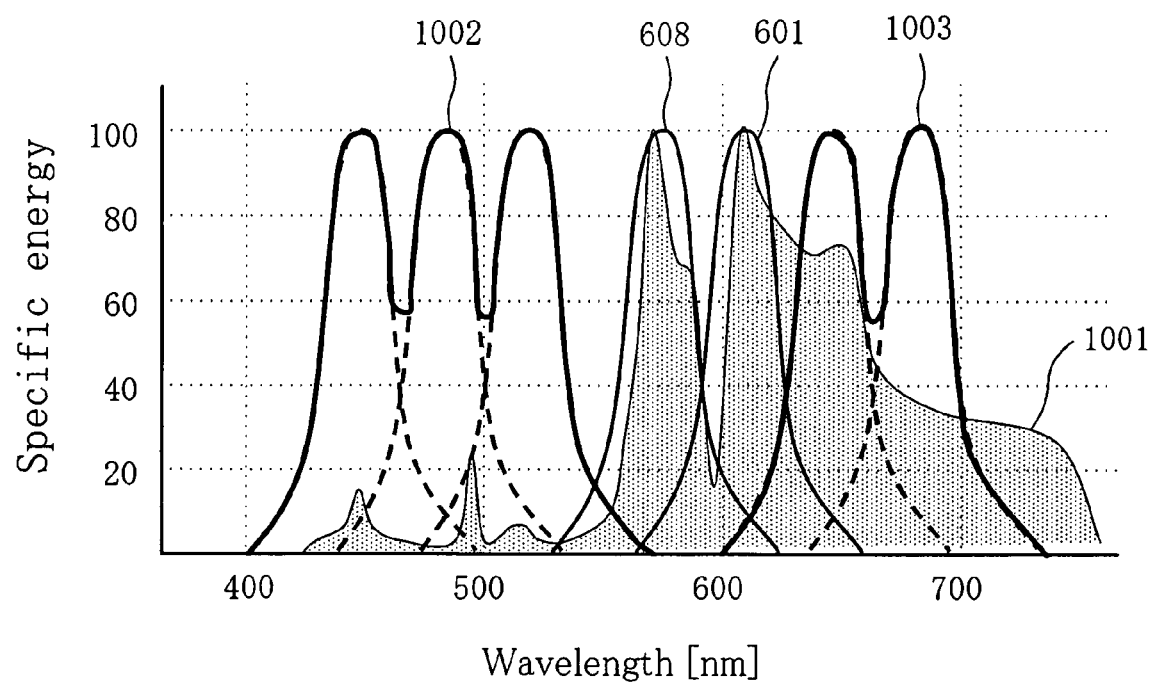
FIG. 11 is a graph showing the relationship between spectral characteristics of filters formed by selecting or combining color information under a high-pressure sodium lamp and spectral characteristics of a high-pressure sodium lamp.

FIG. 11 is a graph showing the relationship between spectral characteristics of four types of filters formed by selecting or combining color information in the filter selection section 703 under a high-pressure sodium lamp and spectral characteristics of the high-pressure sodium lamp.

In this embodiment, the filters 615, 616, 605, 608, 601, 602 and 603 are used. Color information which has passed through the filters 615, 616 and 605 are combined to form a combined filter 1002. Color information which has passed through the filters 602 and 603 are combined to form a combined filter 1003. In FIG. 11, 1001 denotes spectral characteristics of a high-pressure sodium lamp.

As shown in FIG. 11, in the long wavelength side where spectra concentrate, a filter having a narrow bandwidth or filters having a narrow bandwidth even after being combined are allocated to subdivide color information. In the short wavelength side having a relatively small spectrum distribution, a filter which has been obtained by combining many filters to have a wide bandwidth is allocated, thereby effectively obtaining color information.

Figure 12:
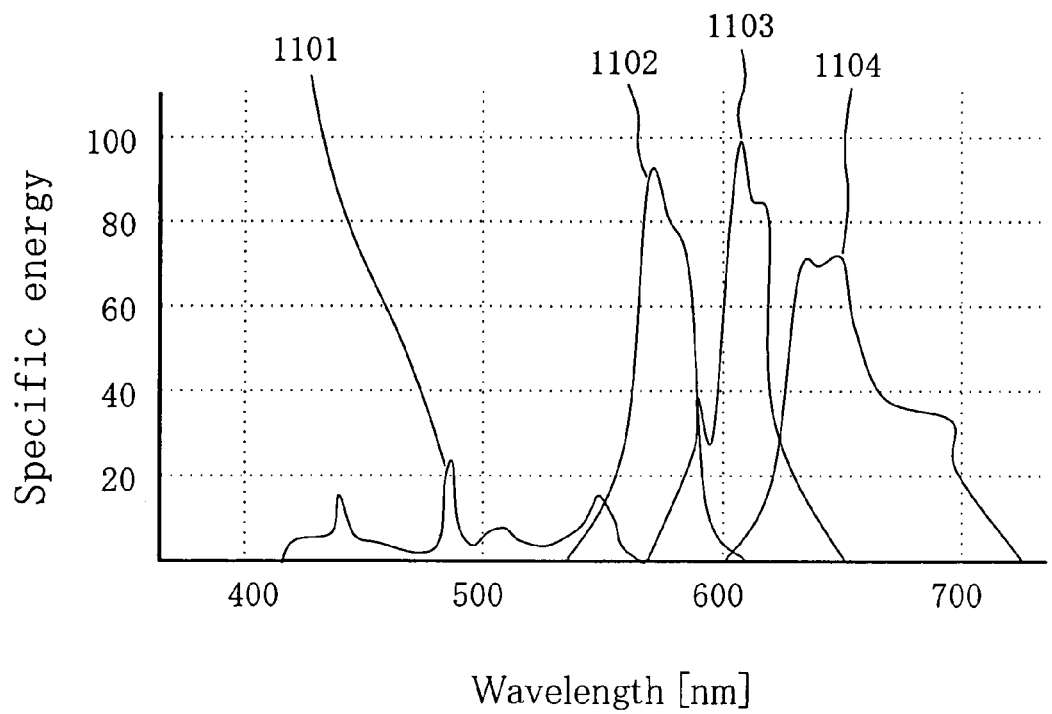
FIG. 12 is a graph showing spectral characteristics of an imaging system according to an embodiment of the present invention under illumination of a high-pressure sodium lamp.

FIG. 12 is a graph showing spectral characteristics of the imaging system according to this embodiment under illumination of a high-pressure sodium lamp. As shown in FIG. 12, in the imaging system of this embodiment, even under illumination of a high-pressure sodium lamp, a plurality of color information 1101 through 1104 can be obtained and thus a color can be identified.

Then, when obtained color information is displayed to a human user, the color information has to be converted into known R, G and B information which can be discriminated by the human eye, and then be displayed. In this case, it is the most preferable that a color of an object to be images is reproduced as a color under white light illumination. However, because information for blue to green components can not be obtained, information for blue to green components has to be estimated from information for a red component. In a known filter, there has been only single information for a red component, and thus such estimation has been very difficult. However, according to this embodiment, since a plurality of information can be obtained, a spectrum pattern of the object to be imaged can be estimated from the information and a color under while light can be estimated to some extent.

Figure 13:
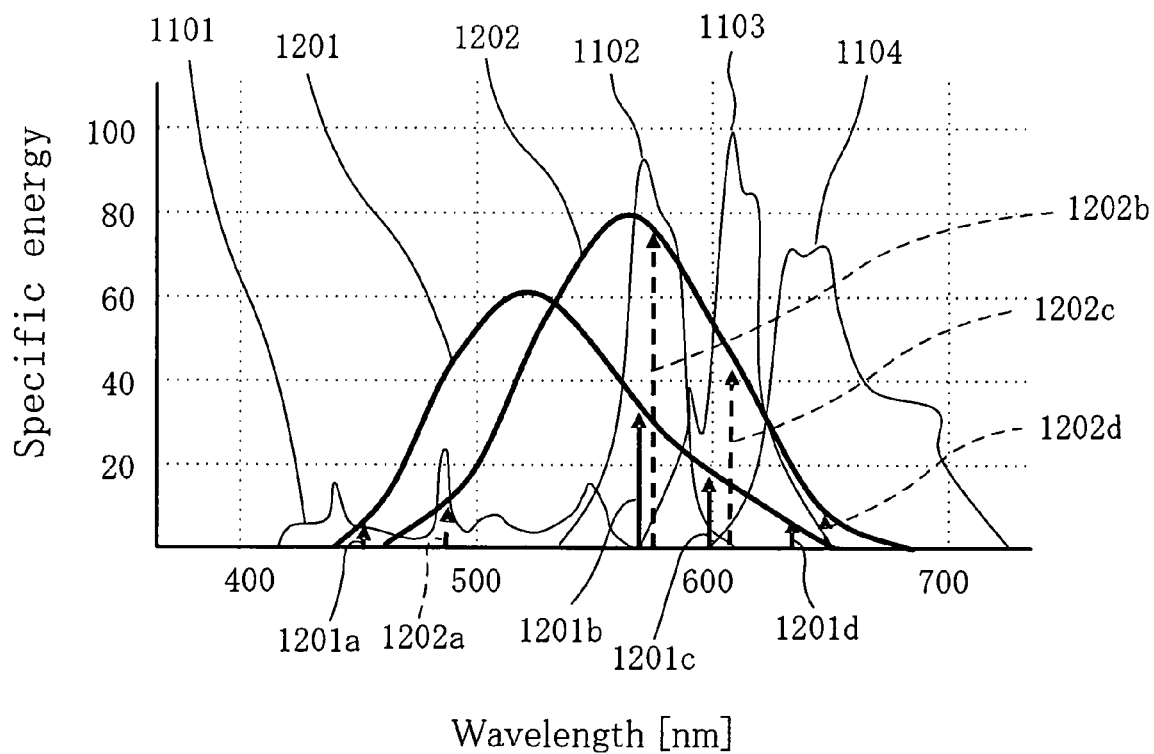
FIG. 13 is a graph showing color information for an object to be imaged by an imaging system according to an embodiment of the present invention, which has been obtained under a high-pressure sodium lamp.

FIG. 13 is a graph showing color information for an object to be imaged by the imaging system of this embodiment, which has been obtained under a high-pressure sodium lamp. In FIG. 13, 1201 denotes spectral characteristics of an object A to be imaged under white light and 1202 denotes spectral characteristics of an object B to be imaged under white light.

In this case, if the objects A and B are imaged by the imaging system of this embodiment under illumination of a high-pressure sodium lamp, color information 1201a, 1201b, 1201c and 1201d can be obtained for the object A. Also, color information 1202a, 1202b, 1202c and 1202d can be obtained for the object B.

As in the above-described manner, according the present invention, information for part of spectrum patterns of the objects A and B can be obtained. That is, although only single information for a color of red can be obtained and spectrum pattern information can not be obtained using a known camera, the present invention allows estimation of spectral characteristics under white light from information for a spectrum pattern.

Figure 14:
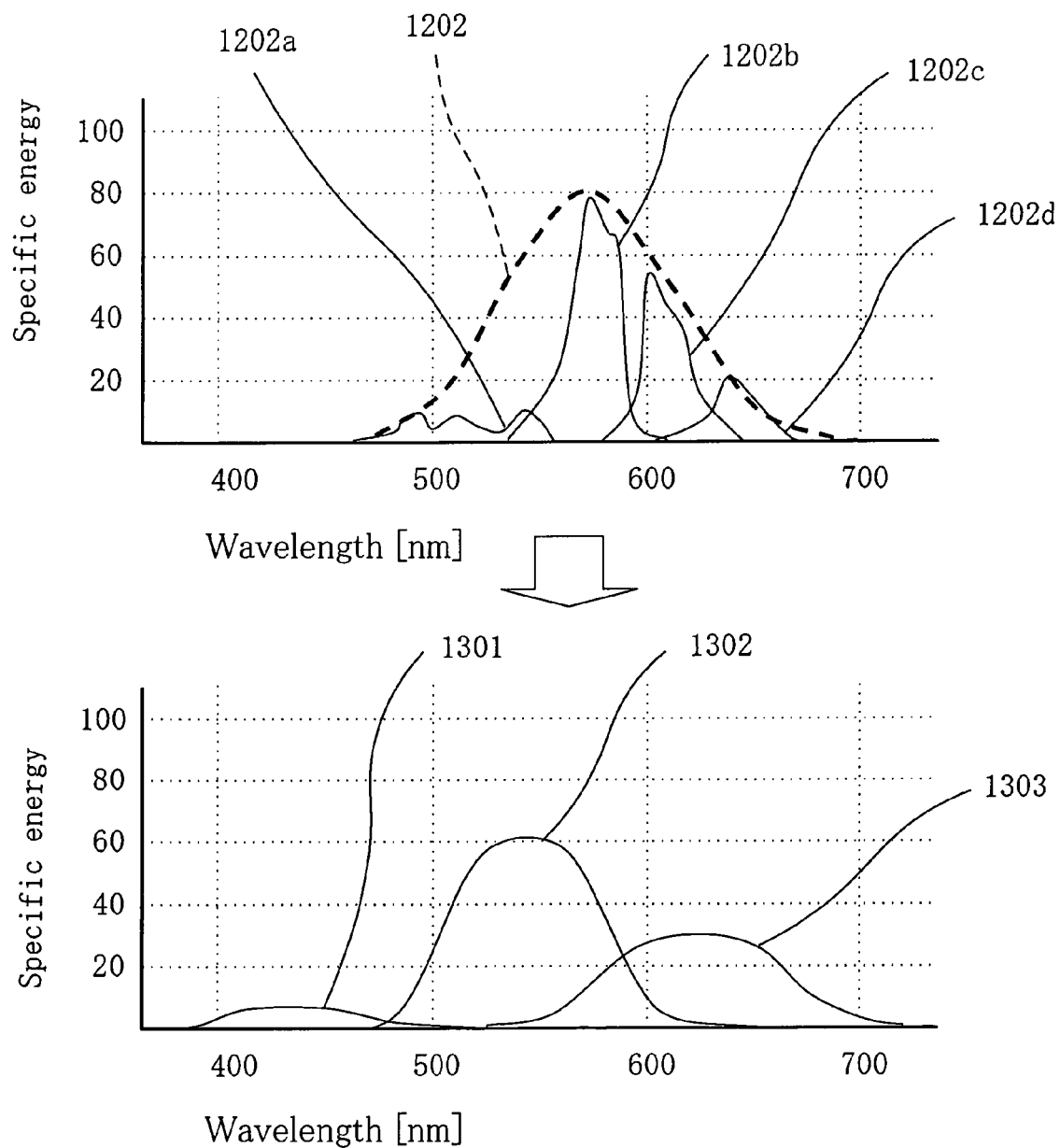
FIG. 14 is a graph showing estimation results for color information obtained by an imaging system according to an embodiment of the present invention under white light.

FIG. 14 is a graph showing estimation results for color information obtained by the imaging system of this embodiment under white light. In FIG. 14, 1202a, 1202b and 1202c denote color information for the object B to be imaged under illumination of a high-pressure sodium lamp.

In this case, based on color information in a narrower bandwidth than a wavelength band (i.e., 400 nm to 700 nm) of light visible to human and color information according to a bandwidth of a filter formed by combination of filters, spectrum 802 of the object B under white light is estimated and the estimated spectrum 802 is converted into known R, G and B (color signals in an entire visible wavelength bandwidth) which can be discriminated by the human eye, thereby obtaining 1301 as a B component, 1302 as a G component and 1303 as a R component.

In this case, as a specific method for estimating color information, a conversion table for directly outputting 1301, 1302 and 1303 from the group of 1202a, 1202b and 1202c can be prepared beforehand. As a method for creating the table, characteristics of an actual object to be imaged are collected to statistically create a table. Hereafter, the table creating method will be described.

Figure 15:
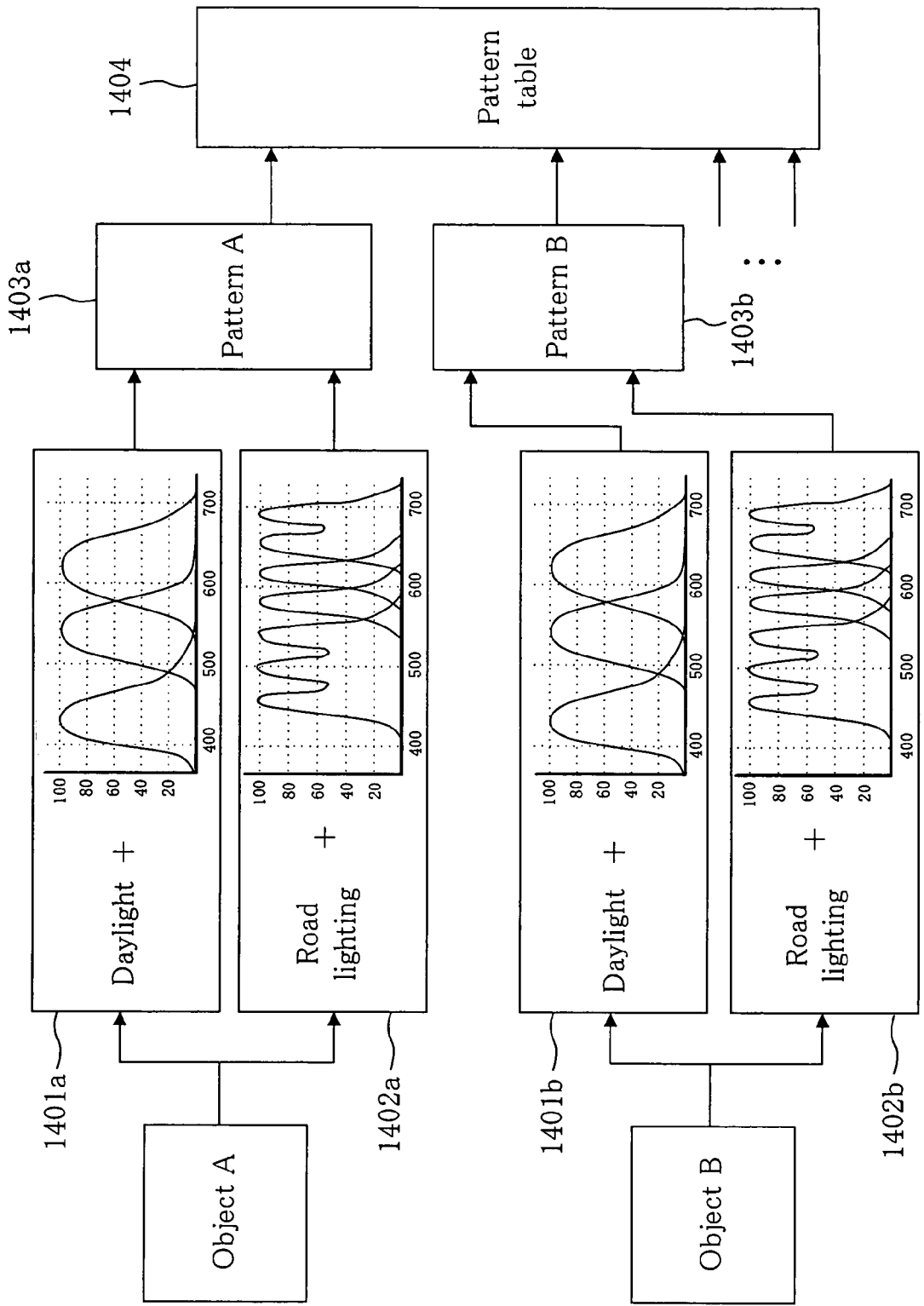
FIG. 15 is a diagram illustrating a method for creating a pattern table in an imaging system according to an embodiment of the present invention.
Figure 16:
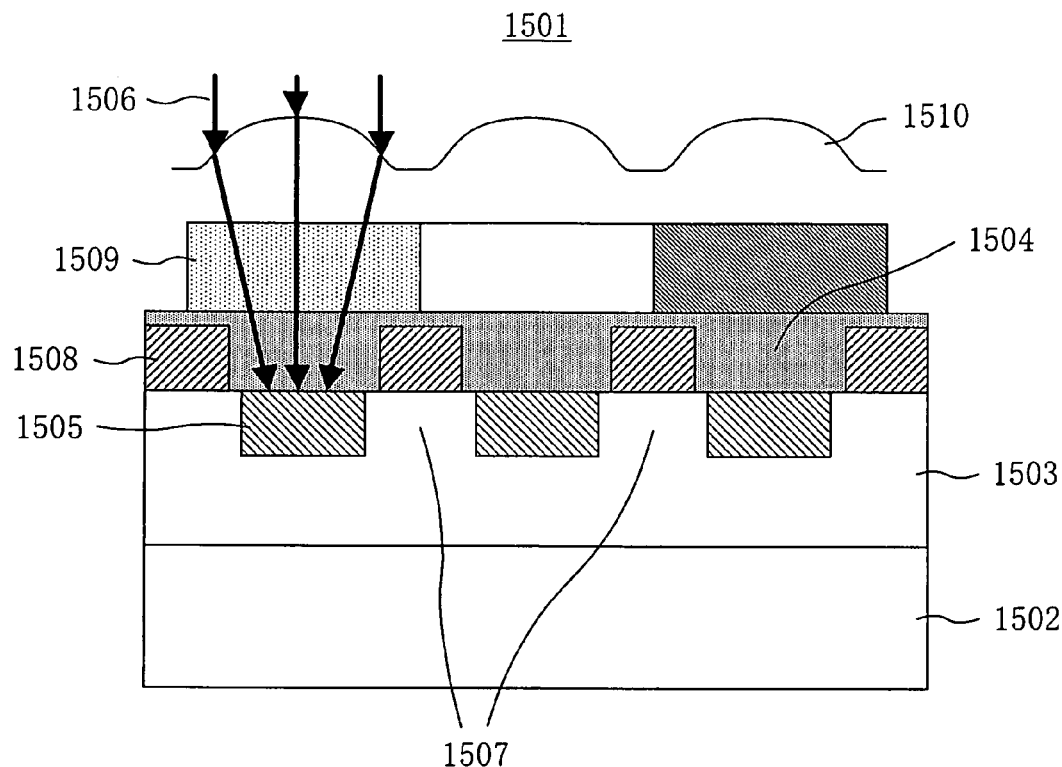
FIG. 16 is a cross-sectional view illustrating a structure of a known imaging system.
Figure 17:
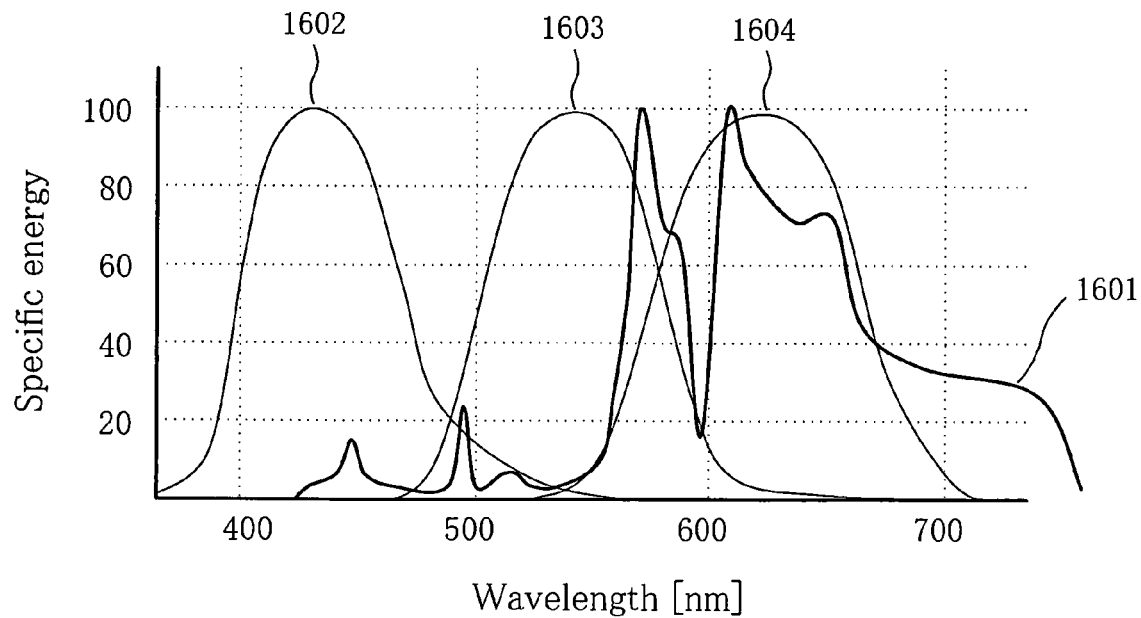
FIG. 17 is a graph showing spectral characteristics of a high-pressure sodium lamp and the human eye.
Figure 18:
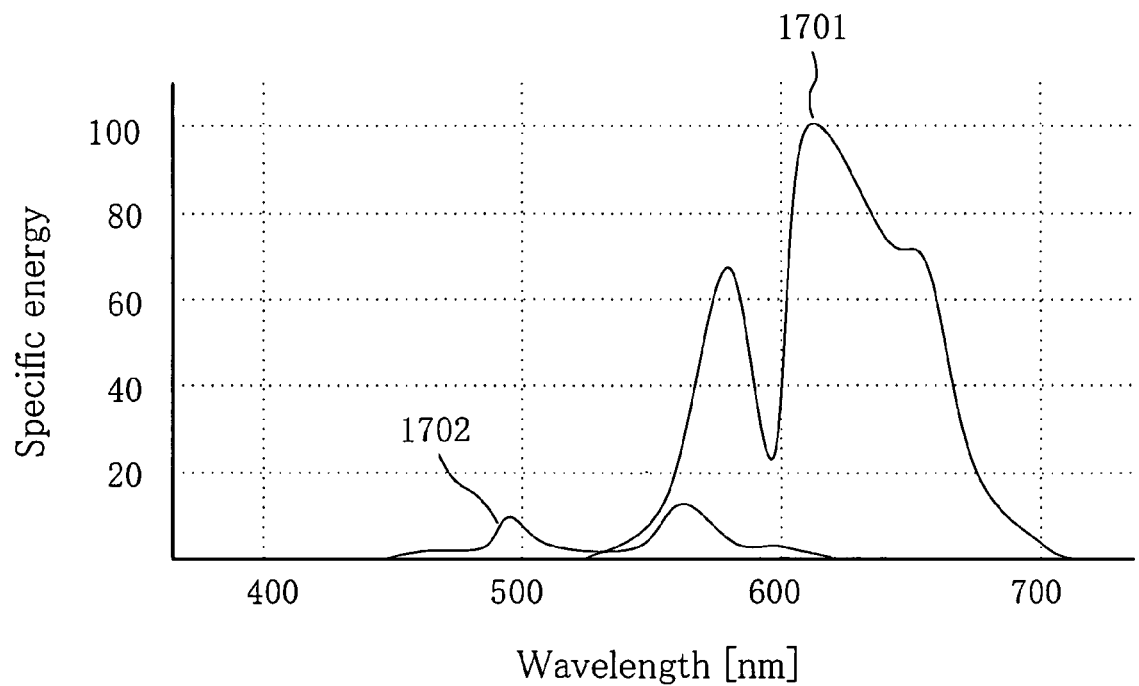
FIG. 18 is a graph showing spectral characteristics of the human eye under high-pressure sodium lamp illumination.

FIG. 15 is a diagram illustrating a method for creating a pattern table in the imaging system of this embodiment. As shown in FIG. 15, in the imaging system, color information of an object is obtained in two types of methods. As a first method, an object is imaged by a camera having spectra according to spectral characteristics of the human eye under white light as shown in 1401a and 1401b, and as a second method, an object is imaged by the imaging system of the present invention under illumination of a high-pressure sodium lamp.

Pattern data 1403a, 1403b, . . . for color information according to the two imaging system are collected for many objects to create a pattern table 1404 for associating an input (i.e., color information in a narrower bandwidth than a wavelength band, i.e., 400 nm to 700 nm, of light visible to human and color information according to a bandwidth of a filter obtained by combination of color information) and an output (a color signal in an entire visible wavelength bandwidth).

In this embodiment, the case where color is estimated from color information under a high-pressure sodium lamp has been described. However, as a matter of course, the same method can be used for a low color rendering light source having other spectral characteristics.

In this embodiment, color information is effectively obtained by four types of filters including combined filters and non-combined filters. To obtain further detailed spectrum pattern information, many types of filters may be used or only filters which are not combined and have a narrow bandwidth may be used. In this case, if color information is subdivided, precision of estimation under white light is increased, but it has to be taken into consideration that pattern table information is also expanded accordingly to have an enormous size.

In this embodiment, a combination operation is performed in an image processing LS1702. However, the present invention is not limited to this embodiment but a combination operation may be performed in an image sensor 101. In such a case, combination means has to be separately provided in the image sensor 101. Such combination means are disclosed, for example, in Japanese Laid-Open Publication No.

3660915, Japanese Laid-Open Publication No. 3877695 and the like and have been known, and therefore will not be specifically described herein.

When combination and selection operations of the filter selection section 703 are performed in the image sensor 101, color information data output from the image sensor 101 is reduced, so that a necessary transmission bandwidth can be reduced.

Specifically, according to this embodiment, when a combination operation is performed in the imaging processing LSI under a high-pressure sodium lamp, at least seven color information through the filters 601, 602, 603, 605, 608, 615 and 616 have to be sent to the imaging processing LSI. However, a combination operation is performed in the image sensor 101, only four color information for total, i.e., color information of the combined filters 1001 and 1002 and color information of the filters 601 and 608 may be sent to the imaging processing LSI. As described above, if a necessary transmission bandwidth can be reduced, the number of pixels of the image sensor 101 can be accordingly increased to improve a resolution and a frame rate and the like can be increased.

As has been described, with an imaging system according to the present invention, very high reliability and the practical effect of increasing color identification ability under white light and low color rendering illumination to a higher level than color identification ability of the naked eye can be achieved. Therefore, the imaging system of the present invention is very useful and has high industrial practicability. Specifically, the imaging system can be mounted in an automobile and used as an imaging system for monitoring images around a vehicle and allowing a human user to visually recognize the images.

What is claimed is:

1. An imaging system comprising:
an image sensor in which a plurality of unit pixels are arranged on a chip; and
an image processing section for converting color components output from the image sensor into color signals,
wherein the image sensor comprises: photoelectric conversion elements for converting incident light to electricity for each of the unit pixels; and a multi-layer film filter, disposed above the photoelectric conversion elements and formed of inorganic materials, for selectively transmitting only a particular wavelength band of the incident light to separate a color component from the incident light, and
the image processing section comprises combining means for combining the color components separated by the multi-layer film filter,
wherein the multi-layer film filter is divided into a plurality of red separation filter groups including filters for transmitting a wavelength band of red and being disposed together, a plurality of green separation filter groups including filters for transmitting a wavelength band of green and being disposed together, a plurality of blue separation filter groups including filters for transmitting a wavelength band of blue and disposed together, and
wherein the red separation filter groups include red filters having similar spectral characteristics to spectral characteristics of the human eye to a red component,
the green separation filter groups include green filters having similar spectral characteristics to spectral characteristics of the human eye to a green component, and
the blue separation filter groups include blue filters having similar spectral characteristics to spectral characteristics of the human eye to a blue component, and wherein the combining means selects only color components which have passed through each of filters of the color separation filter groups, having similar spectral characteristics of spectral characteristics of the human eye, to output the selected color components under white light and, on the other hand, combines color components which have passed through arbitrarily selected filters from the filters of the color separation filter groups to output the combined color components under low color rendering illumination.

2. The imaging system of claim 1, wherein the combining means combines color components which have passed through arbitrarily selected filters from the filters of the color separation filter groups and then outputs the combined color components under white light.

3. The imaging system of claim 1, wherein under low color rendering illumination, the combining means is configured so as to output part of color components which have passed through a plurality of filters arbitrarily selected from the plurality of filters constituting the separation filter groups as it is and combines the rest of color components to output the combined color components.

4. The imaging system of claim 3, wherein the combining means outputs at least four types of color components and the color components are processed in the image processing section to generated color signals.

5. The imaging system of claim 1, wherein the image processing section includes a semiconductor chip (LSI).

6. An image sensor in which a plurality of unit pixels are arranged on a chip, the image sensor comprising:
photoelectric conversion elements for converting incident light to electricity for each of the unit pixels;
a multi-layer film filter, disposed above the photoelectric conversion elements and formed of inorganic materials, for selectively transmitting only a particular wavelength band of the incident light to separate a color component from the incident light; and
combining means for combining color components obtained by separation by the multi-layer film filter,
wherein the multi-layer film filter is divided into a plurality of red separation filter groups including filters for transmitting a wavelength band of red and being disposed together, a plurality of red separation filter groups including filters for transmitting a wavelength band of green and being disposed together, a plurality of blue separation filter groups including filters for transmitting a wavelength band of blue and being disposed together, and
wherein the red separation filter groups include red filters having similar spectral characteristics to spectral characteristics of the human eye to a red component,
the green separation filter groups include green filters having similar spectral characteristics to spectral characteristics of the human eye to a green component, and
the blue separation filter groups include blue filters having similar spectral characteristics to spectral characteristics of the human eye to a blue component, and
wherein the combining means selects only color components which have passed through each of filters of the color separation filter groups, having similar spectral characteristics of spectral characteristics of the human eye, to output the selected color components under white light and, on the other hand, combines color components which have passed through arbitrarily selected filters from the filters of the color separation filter groups to output the combined color components under low color rendering illumination.

7. The image sensor of claim 6, wherein even under white light, the combining means combines color components which have passed through arbitrarily selected filters from the plurality of filters constituting the separation filter groups to output the combined color components.

8. The image sensor of claim 6, wherein under low color rendering illumination, the combining means outputs part of color components which have passed through a plurality of filters arbitrarily selected from the plurality of filters constituting the separation filter groups as it is and, on the other hand, combines the rest of color components to output the combined color components.

* * * * *